United States Patent [19]

Yonekura et al.

[11] Patent Number: 4,820,969
[45] Date of Patent: Apr. 11, 1989

[54] POLARITY COMPENSATED APPARATUS FOR MEASURING THE IMPEDANCE OF A POLAR DEVICE

[75] Inventors: Takanori Yonekura; Tomio Wakasugi, both of Hachioji, Japan

[73] Assignee: Hewlett-Packard Company, Palo Alto, Calif.

[21] Appl. No.: 185,602

[22] Filed: Apr. 22, 1988

[30] Foreign Application Priority Data

Apr. 23, 1987 [JP] Japan .............................. 62-61872[U]

[51] Int. Cl.$^4$ ...................... G01R 27/00; G01R 27/14
[52] U.S. Cl. .............................. 324/57 R; 324/158 D; 324/60 R
[58] Field of Search ................. 324/57 R, 60 R, 60 C, 324/158 D

[56] References Cited

U.S. PATENT DOCUMENTS 4,437,060  3/1984  Ferenczi et al. .................. 324/60 C
4,733,173  3/1988  Bach et al. ....................... 324/158 D Primary Examiner—Reinhard J. Eisenzopf
Assistant Examiner—Anthony L. Miele
Attorney, Agent, or Firm—Karl E. Bring

[57] ABSTRACT

This invention provides a polar device measuring apparatus which can bias a device under test in a proper polarity. The measuring apparatus is computer-controlled and automatically selects the polarity of the bias voltage based on the measured value of voltage across the device.

1 Claim, 3 Drawing Sheets

POLARITY COMPENSATED APPARATUS FOR MEASURING THE IMPEDANCE OF A POLAR DEVICE

FIELD OF THE INVENTION

This invention relates to an apparatus for measuring characteristics of polar devices and particularly relates to an apparatus which can execute measurement without regard to a device polarity.

BACKGROUND OF THE INVENTION

Efficient measuring apparatuses for electric components are a necessary and important tool for the electric and electronic industry and have been improved over time. Examples of such measuring apparatuses are the HP 4192A LF Impedance Analyzer and the HP 4278A 1 kHz/1 MHz Capacitance Meter manufactured and sold by Hewlett-Packard Company, U.S.A. Devices measured by such measuring instruments include both polar and nonpolar devices and are often measured while under DC (direct current) bias condition. As an example, the capacitance of diodes, especially of varacter diodes should be measured as a function of the DC voltage applied to the diodes. FIG. 3 shows a prior art measuring instrument for varactor diodes.

AC (alternating current) signal source 1 for measurement applies AC voltage for measurement to one terminal of a polar device (varactor diode) 5 via capacitor 2. Variable DC supply 16 superimposes DC bias voltage on terminal 3 through resistor 15 and inductor 14. A non-inverting input terminal 8 of high gain amplifier 6 is grounded and inverting input terminal 7 is connected to both output terminal 10 of amplifier 6 via resistor 9 and terminal 4 of polar device 5, such that terminal 4 is virtually grounded and current flowing through device 5 is input to resistor 9. Voltage V3 on terminal 3 is fed into vector ratio calculating means 13 via terminal 11 and switch 12. Alternately, voltage V10 on terminal 10 is also fed into vector ratio calculating means 13 via switch 12.

Vector ratio calculating means utilizes a well known method to calculate impedance Z5 of device 5 according to the following equation:

$$Z5 = (V3/V10) \times R9$$

where R9 is value of resistor 9. The output voltage value of variable direct current source 16 is set by microcomputer 17 via wiring 19. The voltage value to be set is input to microcomputer 17 from external switches or bus 18.

In this measuring apparatus device 5 should be connected across terminal 3 and terminal 4 according to the predetermined polarity. If the device 5 is connected incorrectly, the measured values will be erroneous. Consequently, in the prior art, device polarity needs to be determined prior to measurement. Frequently in chip device measurement, no advanced polarity settings are available, resulting in long measurement times, which are inefficient. Also, the need to determine polarity prior to measurement requires the use of separate equipment.

As has been described, by implementing this invention, a polar device can be connected to a measuring apparatus without regard to its polarity and measured without error. The invention is very useful in this field.

OBJECT OF THE INVENTION

An object of the invention is to provide an apparatus for measuring a polar device capable of automatically determining the polarity of the device and selecting an appropriate DC bias polarity without regard to the physical orientation of the polar device in the measuring apparatus.

BRIEF DESCRIPTION OF THE INVENTION

In one embodiment of the present invention, the DC voltage level across the device under test is measured when the DC bias is impressed and the output polarity of DC source is determined by comparing DC voltage across the device with a threshold voltage. Since this operation is automatically conducted under microprocessor control, polar devices are easily measured without regard to their orientation.

PREFERRED EMBODIMENT OF THE INVENTION

Figure 1:
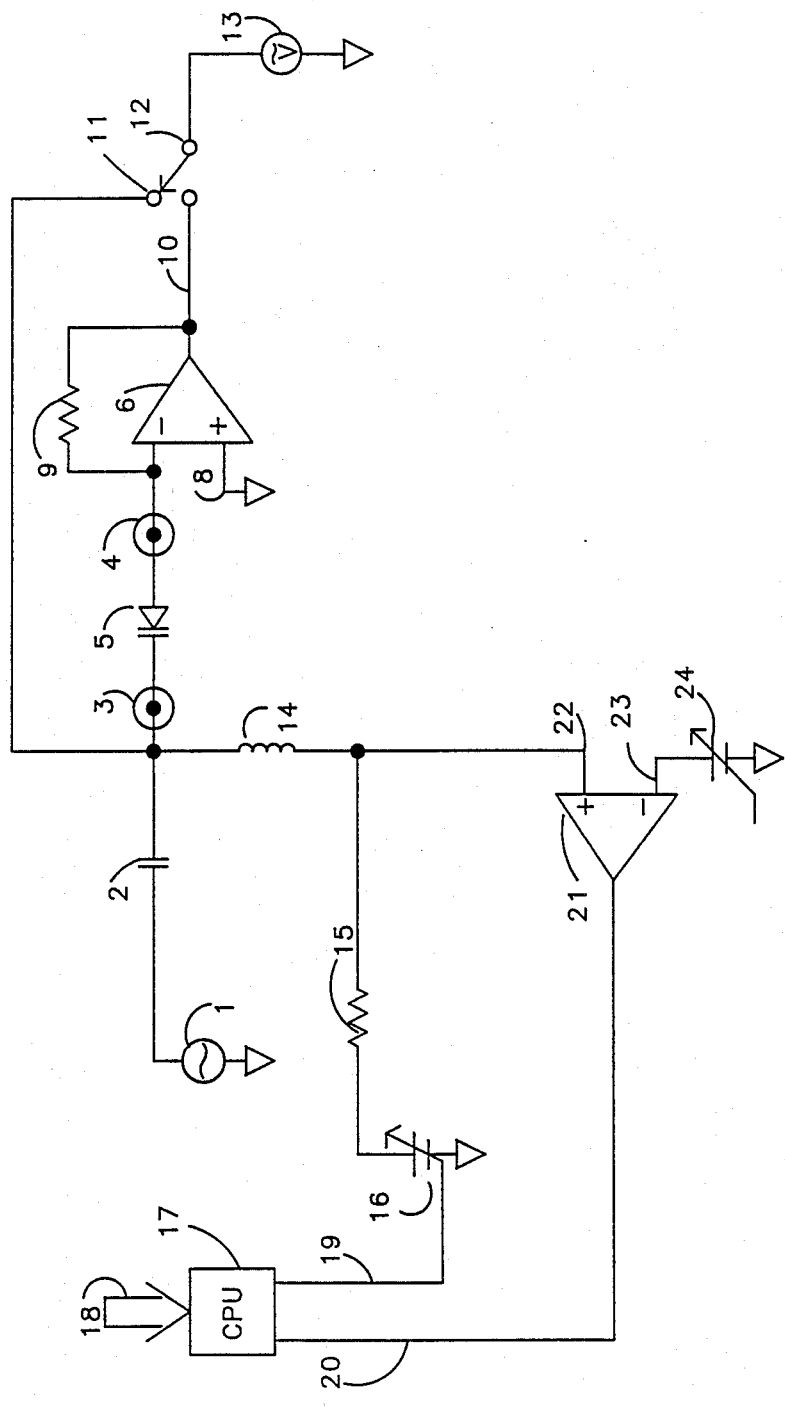
FIG. 1 shows a circuit diagram of an apparatus for measuring polar device in one embodiment of the invention.
Figure 2:
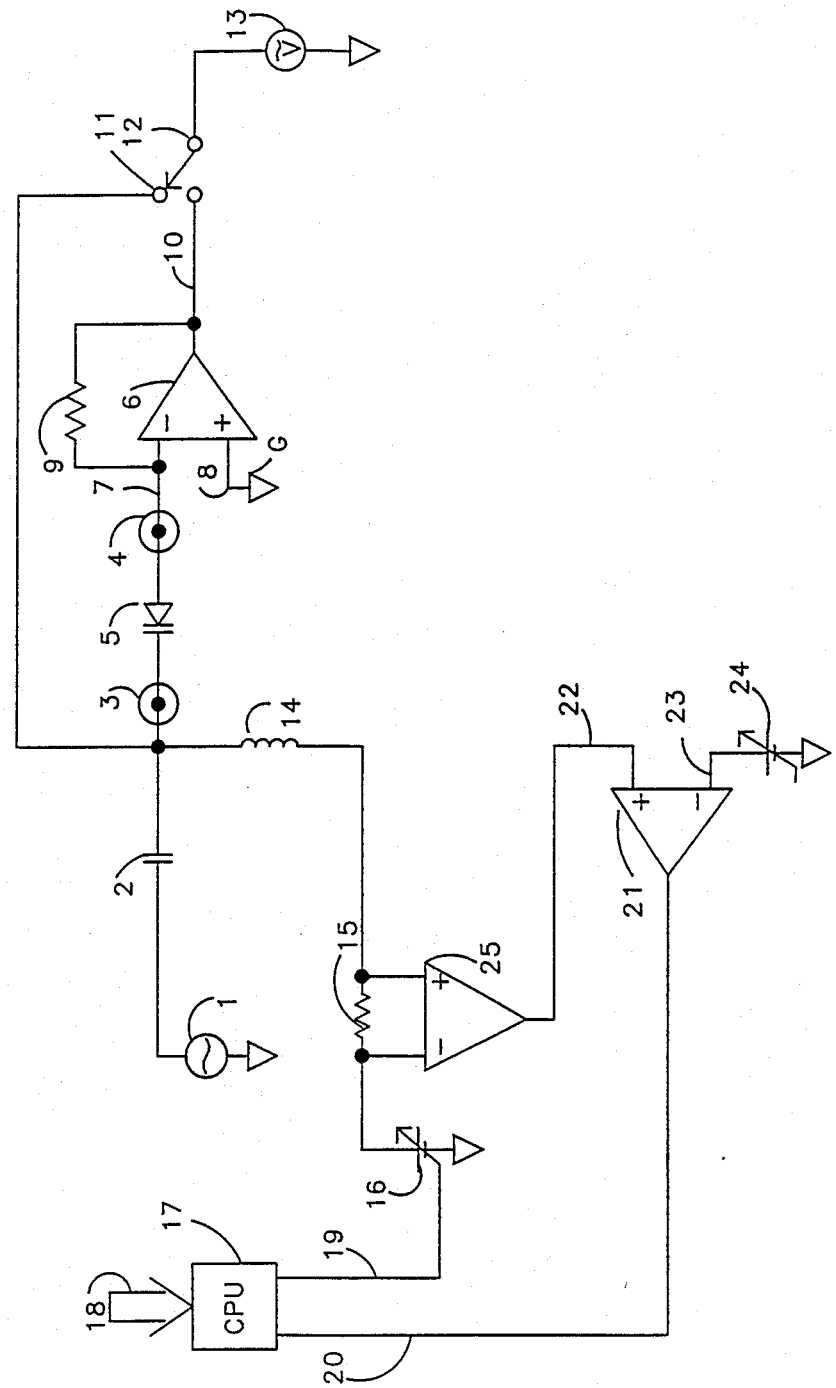
FIG. 2 shows a circuit diagram of an apparatus for measuring polar device in another embodiment of the invention.

FIG. 1 shows one preferred embodiment of the invention. FIG. 2 shows another preferred embodiment of the invention. In FIGS. 1 and 2, the same reference numbers are used for devices and elements of substantially equal function and performance as in FIG. 3, as follows:

1: AC signal source; 2: capacitor; 5: polar device under measurement (variable capacitor diode); 6: high gain amplifier; 13: vector ratio calculating means; 14: AC choke inductor; 15: resistor to detect DC; 16: variable DC voltage source; 17: microcomputer; 21: comparator; 24: threshold voltage source; 25: amplifier.

Figure 3:
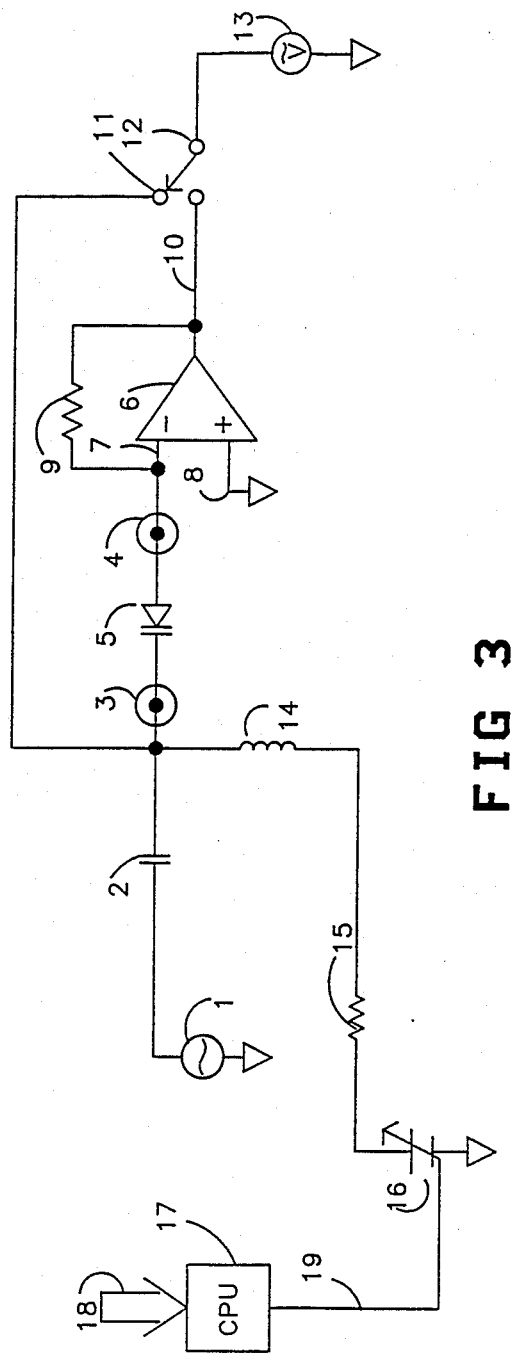
FIG. 3 shows a prior art measuring instrument for varactor diodes.

In FIG. 1, a comparator 21 and a threshold voltage source 24 are added to FIG. 3.

Comparator 21 via non-inverting terminal 22 is connected to a junction of resistor 15 and inductor 14 to receive the DC voltage impressed on device 5. Inductor 14 prohibits the AC output from an AC signal source 1 from flowing into terminal 22.

Resistor 15 causes the voltage on terminal 22 to vary depending on the polarity of device 5 while simultaneously preventing unacceptable stress on device 5 with regard to voltage or current. Inverting input terminal 23 of comparator 21 is connected to the threshold voltage source 24 such that the DC voltage across device 5 and the output of voltage source 24 are compared with each other.

In response to the comparison result of comparator 21 input via line 20, microcomputer 17 defines the polarity of the variable DC voltage source 16 via line 19.

In one embodiment of the invention, the output of the variable DC voltage source 16 is set at +1 V, the output voltage of threshold voltage source 24 is set at +0.8 V and device 5 is a variable capacitor diode having a threshold voltage of +0.6 V.

When a cathode of device 5 is connected to terminal 3, there is no reverse current through device 5 and the voltage on terminal 22 becomes approximately +1 V if the value of resistor 15 is approximately less than 10k ohms. Then output of the comparator takes a high level and microcomputer 17 interprets the output to indicate that the impressed bias voltage is correct and therefore leaves the polarity of the variable DC voltage source 16 as set. Alternately, when the cathode of device 5 is connected to terminal 4, the voltage on terminal 22 is reduced to +0.6 V due to the conducting device 5 and the output of comparator 21 takes a low level.

Then the microcomputer 17 inverts the output polarity of the variable voltage source 16 to −1 V via line 19. The input voltage on terminal 22 becomes −1 V and output of comparator 21 remains at a low level. In contrast to the apparatus in FIG. 1 detecting the voltage across device 5, in FIG. 2, amplifier 25 is newly introduced and the terminal voltage across resistor 15 produced by the current through it is detected and fed back to terminal 22. Operation of the apparatus in FIG. 2 is easily understood as similar to the operation of the apparatus in FIG. 1.

Further, inductor 14 may be replaced by a resistor, and a capacitor may be added between ground and the junction of resistor 15 and this replacement resistor to bypass the AC current. In addition, where the AC component is negligibly smaller than the DC component, inductor 14 may be eliminated.

Yet further, any one skilled in the art can easily realize a variable DC voltage source 16 by cascading a digital to analog converter and polarity inverting amplifier or by simply employing a digital to analog converter. Similarly, threshold voltage source 24 is easily controlled to vary values set from microcomputer 17.

We claim:

1. An apparatus for measuring a polar device having a first and second terminal comprising;
   an AC signal source means for driving the first terminal of the polar device through AC coupling,
   a variable DC supply means for driving the first terminal through an AC choke circuit,
   a negative feedback amplifier means for virtually grounding the second terminal of the polar device and for generating output voltage proportional to current from the second terminal,
   DC detector circuit for detecting a DC signal component impressed on the polar device through the AC choke circuit,
   a control means for receiving the DC signal component and for comparing the DC signal component with a predetermined threshold and for selecting polarity of the output of the variable DC supply means in response to the comparison result, and
   a vector ratio computing means for measuring impedance of the polar device from the AC voltage on the first terminal and from the output of the negative feedback amplifier means.

* * * * *

UNITED STATES PATENT AND TRADEMARK OFFICE
CERTIFICATE OF CORRECTION

PATENT NO. : 4,820,969

DATED : April 11, 1989

INVENTOR(S) : Takanori Yonekura and Tomio Wakasugi

It is certified that error appears in the above-identified patent and that said Letters Patent is hereby corrected as shown below:

Column 1, line 47, "Z5=(V3/V10)XR9" should read
-- Z5= -(V3/V10) x R9 --

Signed and Sealed this

Third Day of October, 1989

Attest:

DONALD J. QUIGG

Attesting Officer

Commissioner of Patents and Trademarks